(12) United States Patent
Chatterjee (10) Patent No.: US 8,785,304 B2
(45) Date of Patent: Jul. 22, 2014

(54) P-I-N STRUCTURES AND METHODS FOR FORMING P-I-N STRUCTURES HAVING AN I-LAYER FORMED VIA HOT WIRE CHEMICAL VAPOR DEPOSITION (HWCVD)

(75) Inventor: Sukti Chatterjee, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 3 days.

(21) Appl. No.: 13/570,928

(22) Filed: Aug. 9, 2012

(65) Prior Publication Data

US 2013/0048987 A1 Feb. 28, 2013

Related U.S. Application Data (60) Provisional application No. 61/527,720, filed on Aug. 26, 2011.

(51) Int. Cl.
*H01L 21/00* (2006.01)
(52) U.S. Cl.
USPC .......................................... 438/482
(58) Field of Classification Search
USPC ..................... 438/482; 257/E21.09
See application file for complete search history.

(56) References Cited

U.S. PATENT DOCUMENTS

| 2012/0295419 | A1 | 11/2012 | Chatterjee et al. |
| 2012/0312326 | A1 | 12/2012 | Chatterjee et al. |
| 2013/0025655 | A1* | 1/2013 | Bedell et al. .................. 136/255 |
| 2013/0065401 | A1 | 3/2013 | Chatterjee |

OTHER PUBLICATIONS

International Search Report and Written Opinion mailed Jan. 24, 2013 for PCT Application No. PCT/US2012/041078.
International Search Report and Written Opinion mailed Mar. 4, 2013 for PCT Application No. PCT/US2012/054575.

\* cited by examiner

*Primary Examiner* — Tran Tran
(74) *Attorney, Agent, or Firm* — Moser Taboada; Alan Taboada (57) ABSTRACT

Embodiments of the present invention provide p-i-n structures and methods for forming p-i-n structures useful, for example, in photovoltaic cells. In some embodiments, a method for forming a p-i-n structure on a substrate may include forming a bi-layer p-type layer on the substrate by: depositing a microcrystalline p-type layer atop the protective layer; and depositing an amorphous p-type layer atop the microcrystalline p-type layer; depositing an amorphous i-type layer via hot wire chemical vapor deposition atop the amorphous p-type layer; and depositing an amorphous n-type layer atop the amorphous i-type layer. A p-i-n structure may include a bi-layer p-type layer disposed above a substrate, the bi-layer p-type layer having a microcrystalline p-type layer and an amorphous p-type layer disposed atop the microcrystalline p-type layer; an amorphous i-type layer disposed atop the bi-layer p-type layer; and an n-type layer disposed atop the i-type layer.

11 Claims, 5 Drawing Sheets

P-I-N STRUCTURES AND METHODS FOR FORMING P-I-N STRUCTURES HAVING AN I-LAYER FORMED VIA HOT WIRE CHEMICAL VAPOR DEPOSITION (HWCVD)

CROSS-REFERENCE TO RELATED APPLICATIONS

This application claims benefit of U.S. provisional patent application Ser. No. 61/527,720, filed Aug. 26, 2011, which is herein incorporated by reference.

FIELD

Embodiments of the present invention generally relate to semiconductor substrate processing.

BACKGROUND

P-I-N structures are widely used, for example, in the manufacture of photovoltaic cells. A P-I-N structures generally includes a lightly doped 'near' intrinsic semiconductor region (e.g., an i-layer) between a p-type semiconductor region (e.g., a p-layer) and an n-type semiconductor region (e.g., an n-layer).

The inventor has observed that conventional deposition processes utilized to form i-type layers for p-i-n structures typically result in amorphous i-type layers having a high degree of disorder within the amorphous network. The inventor has further observed that when forming photovoltaic (PV) grade amorphous i-type layers for applications such as solar or photovoltaic cells, such disorder within the amorphous network causes increased light induced degradation (LID), thus decreasing the efficiency of the resultant device.

Therefore, the inventor has provided improved methods for forming p-i-n structures useful, for example, in the production of photovoltaic devices.

SUMMARY

Embodiments of the present invention provide p-i-n structures and methods for forming p-i-n structures useful, for example, in photovoltaic cells. In some embodiments, a method for forming a p-i-n structure on a substrate may include forming a bi-layer p-type layer on the substrate by: depositing a microcrystalline p-type layer atop the protective layer; and depositing an amorphous p-type layer atop the microcrystalline p-type layer; depositing an amorphous i-type layer via hot wire chemical vapor deposition atop the amorphous p-type layer; and depositing an amorphous n-type layer atop the amorphous i-type layer.

In some embodiments, a p-i-n structure may include a bi-layer p-type layer disposed above a substrate, the bi-layer p-type layer having a microcrystalline p-type layer and an amorphous p-type layer disposed atop the microcrystalline p-type layer; an amorphous i-type layer disposed atop the bi-layer p-type layer; and an n-type layer disposed atop the i-type layer.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention provide p-i-n structures and methods for forming p-i-n structures useful, for example, in photovoltaic cells. The inventive methods may advantageously provide p-i-n structures with an amorphous i-type layer that has a reduced amorphous network disorder as compared to conventionally formed amorphous i-type layers, thereby reducing light induced degradation (LID). In embodiments where the amorphous i-type layer is a photovoltaic grade i-type layer, for use in, for example, a photovoltaic cell, the reduced light induced degradation advantageously increases the overall efficiency of the finished device. The inventive methods may further advantageously reduce hydrogen diffusion into layers disposed beneath the p-i-n structure (e.g. the substrate and or transparent conducting oxide (TCO) layer described below) when fabricating the p-i-n structure, thereby further increasing the efficiency of a device incorporating the p-i-n structure, such as a photovoltaic device.

Silicon and other semiconductors can be formed into solids having varying degrees of crystallinity. A described herein, solids having essentially no crystallinity are amorphous, and silicon with negligible crystallinity is referred to as amorphous silicon. Completely crystalline silicon is referred to as crystalline, polycrystalline, or monocrystalline silicon. Polycrystalline silicon is crystalline silicon including numerous crystal grains separated by grain boundaries. Monocrystalline silicon is a single crystal of silicon. Solids having partial crystallinity, that is a crystal fraction between about 5% and about 95%, are referred to as nanocrystalline or microcrystalline, generally referring to the size of crystal grains suspended in an amorphous phase. Solids having larger crystal grains are referred to as microcrystalline, whereas those with smaller crystal grains are nanocrystalline. It should be noted that the term "crystalline silicon" may refer to any form of silicon having a crystal phase, including microcrystalline and nanocrystalline silicon.

Figure 1:
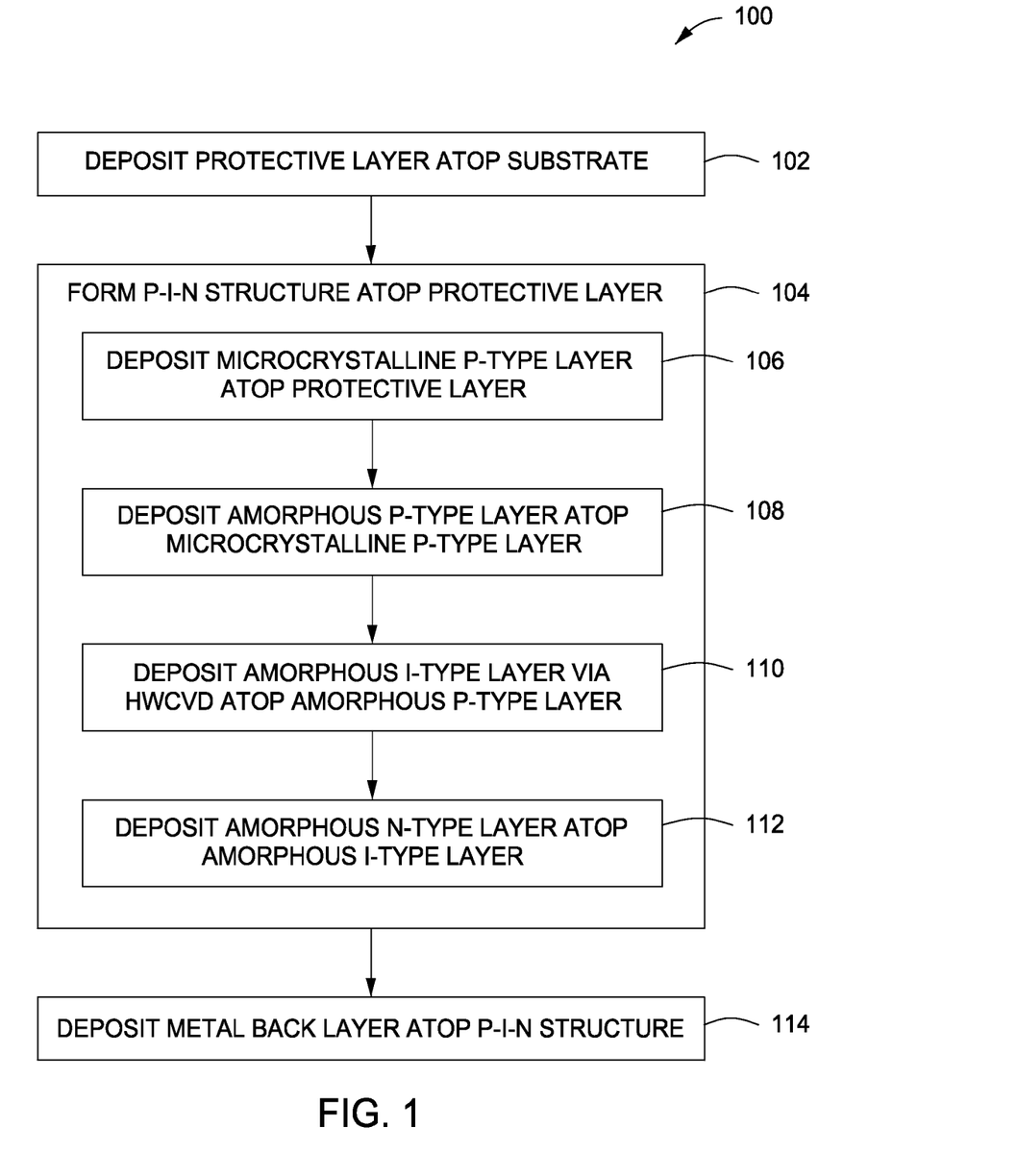
FIG. 1 is a flow diagram of a method for forming a p-i-n structure in accordance with some embodiments of the present invention.

FIG. 1 is a flow diagram of a method 100 for forming a p-i-n structure in accordance with some embodiments of the present invention. Although the method 100 depicts fabrication of the p-i-n structure in the context of a photovoltaic cell, the method 100 (and the p-i-n structure) may also be advantageously used in other applications. FIGS. 2A-G are illustrative cross-sectional views of the substrate during different stages of the processing sequence of FIG. 1 in accordance with some embodiments of the present invention.

The method 100 is illustratively described as carried out on a substrate 202 having a transparent conducting oxide (TCO) layer 204 formed thereon. The substrate 202 may be any substrate suitable to form a p-i-n junction, and in the illustrative case of FIGS. 2A-G, to form a photovoltaic cell. For example, in some embodiments, the substrate 202 may be a glass substrate, a polymer substrate, a metal substrate, or the like.

Figure 2A:
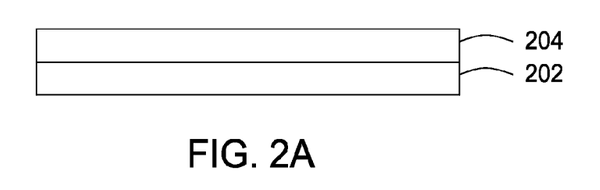
FIGS. 2A-G are illustrative cross-sectional views of a substrate during different stages of the processing sequence of FIG. 1 in accordance with some embodiments of the present invention.

The TCO layer 204 may comprise any materials suitable to provide sufficient transparency and electrical conductivity for the device, such as those materials commonly used to form TCO layers. For example, in some embodiments, the TCO layer 204 may comprise tin oxide (SnO), zinc oxide (ZnO), cadmium stannate ($Cd_2SnO_4$), combinations thereof, or the like. In some embodiments, the TCO layer 204 may further include a dopant. For example, in some embodiments, the TCO layer may comprise a tin-doped indium oxide, such as a solid solution of indium oxide ($In_2O_3$) and tin oxide ($SnO_2$). The TCO layer 204 may also additionally include other dopants and/or components. For example, in embodiments where the TCO layer 204 comprises zinc oxide (ZnO), the TCO layer 204 may further include dopants such as tin (Sn), aluminum (Al), gallium (Ga), boron (B), and other suitable dopants.

In some embodiments, to improve light absorption by enhancing light trapping, one or more of the substrate 202, TCO layer 204 or one or more layers (e.g., layers 206, 208, 210, 212, 214 described below) formed thereover may be optionally textured by wet etching, plasma etching, ion bombardment, and/or other processes suitable to form a desired texture on the one or more layers.

Figure 2B:
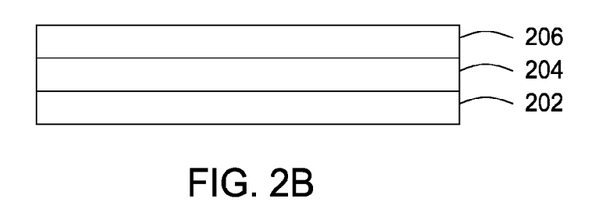

The method 100 generally begins at 102, where a protective layer 206 may be deposited atop the TCO layer 204, as shown in FIG. 2B. The protective layer 206 may comprise any suitable materials to protect the TCO layer 206 from diffusion of hydrogen during subsequent processing (e.g., deposition of subsequent layers) while not adversely affecting desired characteristics of the p-i-n structure or the device incorporating the p-i-n structure. For example, in a photovoltaic cell application, the protective layer should not adversely impact photovoltaic characteristics such as efficiency (Eff), short circuit current density (Jsc), open current voltage (Voc), fill factor (FF), or the like. In some embodiments, the protective layer may comprise zinc oxide (ZnO) or the like.

The protective layer 206 may be deposited to any thickness suitable to provide the aforementioned protection to the TCO layer 206 while not adversely affecting the photovoltaic characteristics of the device. In some embodiments, the protective layer 206 may be deposited to a thickness of about 2 to about 20 nm, or in some embodiments, about 10 nm.

The protective layer 206 may be formed via any process suitable to deposit the protective layer 206 in accordance with the materials utilized and desired thickness. For example, in some embodiments, the protective layer 206 may be formed via a plasma enhanced chemical vapor deposition (PECVD) process in a suitable PECVD chamber. Examples of suitable chambers include, but are not limited to, PECVD chambers, such as the Applied PECVD 5.7 system, commercially available from Applied Materials, Inc., of Santa Clara, Calif.

Next, at 104, a p-i-n structure 209 may be formed atop the protective layer 206. The p-i-n structure 209 includes a bi-layer p-type layer, an i-type layer, and an n-type layer. The inventor has observed that in p-i-n structures having i-type layers formed, for example, via hot wire chemical vapor deposition (HWCVD) processes (e.g., as described below) excess atomic hydrogen produced during i-type layer formation may diffuse into the TCO layer 204, thereby adversely affecting the properties of the TCO layer 204. However, the inventor has observed that by changing an interface between the p-type and i-type layers of the p-i-n structure, such as by providing the bi-layer p-type layer as described herein, the hydrogen diffusion may be reduced or eliminated, thereby reducing or eliminating any adverse effects due to the hydrogen diffusion. Accordingly, in some embodiments, the formation of the p-i-n structure 209 atop the protective layer 206 begins by depositing a first layer of the bi-layer p-type layer, as shown at 106 and in FIG. 2C. The first layer comprises a micro-crystalline p-type layer 208 that may be deposited atop the protective layer 206. The inventor has observed that by providing the micro-crystalline p-type layer 208 atop the protective layer 206 hydrogen diffusion from subsequent processing may be further reduced or eliminated.

Figure 2C:
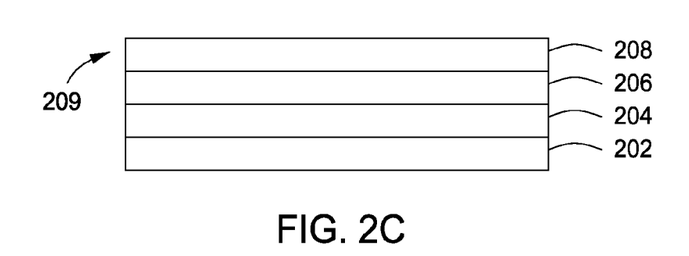

The micro-crystalline p-type layer 208 may comprise any materials suitable to provide the proper properties to form a desired p-i-n structure 209 (e.g., suitable for a p-type layer of a p-i-n structure). In some embodiments, the micro-crystalline p-type layer 208 may comprise micro-crystalline silicon, micro-crystalline silicon carbide, or the like. The term micro-crystalline silicon is inclusive of smaller order structures, such as nano-crystalline silicon.

The micro-crystalline p-type layer 208 may be deposited to any thickness suitable to provide the aforementioned protection to the TCO layer 206 while not adversely affecting the photovoltaic characteristics of the device. For example, in some embodiments, the micro-crystalline p-type layer 208 may be deposited to a thickness of about 2 to about 10 nm, or in some embodiments about 5 nm.

The micro-crystalline p-type layer 208 may be formed via any process suitable to deposit the micro-crystalline p-type layer 208 in accordance with the materials utilized and desired thickness. For example, in some embodiments, the micro-crystalline p-type layer 208 may be formed via a chemical vapor deposition (CVD) process, for example such as a Plasma Enhanced Chemical Vapor Deposition (PECVD) in a suitable PECVD chamber (e.g., the PECVD chamber discussed above).

Figure 2D:
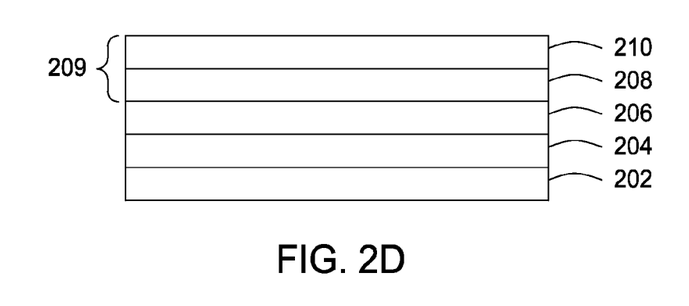

Next, at 108, an amorphous p-type layer 210 is deposited atop the micro-crystalline p-type layer 208 (e.g., the second layer of the bi-layer p-type layer), as shown in FIG. 2D. The amorphous p-type layer 210 may comprise any materials suitable to provide the necessary properties to form a desired p-i-n structure 209 (e.g., suitable for a p-type layer of a p-i-n structure). In some embodiments, the amorphous p-type layer 210 may comprise amorphous silicon (Si), amorphous silicon carbide (SiC) or the like.

The amorphous p-type layer 210 may be deposited to any thickness suitable to suitable to form the p-i-n structure 209 and provide the desired photovoltaic characteristics to the finished device. For example, in some embodiments, the amorphous p-type layer 210 may be deposited to a thickness of about 5 to about 25 nm, or in some embodiments, about 20 nm.

The amorphous p-type layer 210 may be formed via any process suitable to deposit the amorphous p-type layer 210 in accordance with the materials utilized and desired thickness. For example, in some embodiments, the amorphous p-type layer 210 may be formed via a chemical vapor deposition (CVD) process, for example such as a Plasma Enhanced Chemical Vapor Deposition (PECVD) in a suitable PECVD chamber (e.g., the PECVD chamber discussed above). The amorphous p-type layer 210 may be formed utilizing the same, or in some embodiments, different processing chamber utilized to form the micro-crystalline p-type layer 208 described above. In embodiments where the amorphous p-type layer 210 is formed utilizing a different process chamber than the micro-crystalline p-type layer 208, the separate process chambers may be coupled together as part of a processing system, for example, such as an inline tool, a cluster tool, or the like.

In some embodiments, the amorphous p-type layer 210 and/or the micro-crystalline p-type layer 208 may include a dopant to enhance charge collection, thus increasing the efficiency of the device. The dopant may be any one or more dopants suitable to provided the aforementioned enhancement, for example a Group III element such as a boron or aluminum containing dopant. In embodiments where the dopant is a boron containing dopant, the dopant may be provided by a dopant precursor comprising trimethylboron ($B(CH_3)_3$ or TMB), diborane ($B_2H_6$), boron trifluoride ($BF_3$), and triethylboron ($B(C_2H_5)_3$ or TEB), or the like.

Figure 2E:
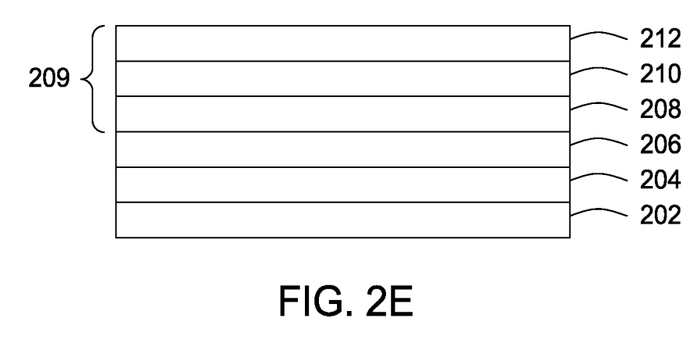

Next, at 110, an amorphous i-type layer 212 is deposited atop the amorphous p-type layer 210 via a hot wire chemical vapor deposition (HWCVD) process as depicted in FIG. 2E and as described more fully below with respect to FIG. 3. The inventor has observed that by depositing the amorphous i-type layer 212 via a HWCVD process, the disorder of the amorphous network of the amorphous i-type layer 212 is less than that of an i-type layer formed by other conventionally used processing methods, for example such as PECVD. By providing an amorphous i-type layer having a lesser amorphous network, the light induced degradation (LID) of the amorphous i-type layer is reduced, thereby providing a finished device having an overall higher efficiency and longer useful life. In addition, in some embodiments, the HWCVD process may advantageously provide a faster deposition rate for forming the amorphous i-type layer 212. Also, in some embodiments, the HWCVD process may advantageously provide an amorphous i-type layer 212 having improved optoelectronic properties as compared to amorphous i-type layers deposited by other conventional techniques.

The inventor has observed that although the above advantages may be provided in an i-type layer formed via a HWCVD process, the HWCVD process also undesirably produces excess atomic hydrogen. However, the protective layer 206 described above advantageously reduces or eliminates any hydrogen diffusion into the TCO layer 204, which would otherwise adversely affect the properties of the TCO layer 204 (and the overall device).

The amorphous i-type layer 212 may comprise any materials suitable to provide the proper properties to form a desired p-i-n structure 209. In some embodiments, the amorphous i-type layer 212 may comprise silicon (Si), silicon and hydrogen (Si—H) or the like.

The amorphous i-type layer 212 may be formed via any HWCVD process suitable to deposit the amorphous i-type layer 212 in accordance with the materials utilized and desired thickness, for example, such as the HWCVD process described below with respect to FIG. 3.

Figure 2F:
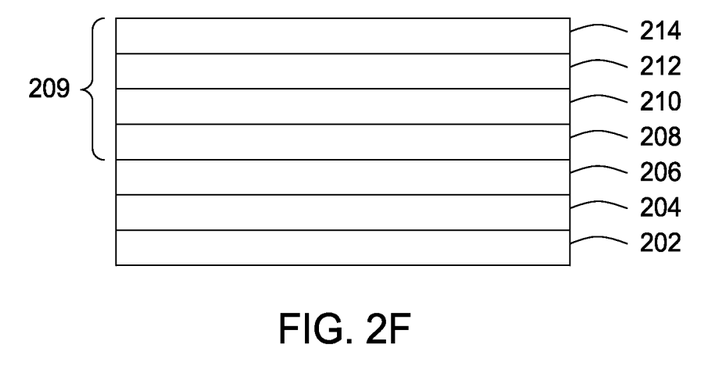

Next, at 112, an amorphous n-type layer 214 is deposited atop the amorphous i-type layer 212, as shown in FIG. 2F. The amorphous n-type layer 214 may comprise any materials suitable to provide the proper properties to form a desired p-i-n structure (e.g., to form an n-type layer of the p-i-n structure). In some embodiments, the amorphous n-type layer 214 may comprise silicon (Si), n-doped silicon (such as phosphorus doped silicon), or the like.

The amorphous n-type layer 214 may be deposited to any thickness suitable to suitable to form the p-i-n structure 209 and provide the desired photovoltaic characteristics to the finished device. For example, in some embodiments, the amorphous n-type layer 214 may be deposited to a thickness of about 5 to about 20 nm, for example, about 10 nm.

The amorphous n-type layer 214 may be formed via any process suitable to deposit the amorphous n-type layer 214 in accordance with the materials utilized and desired thickness. For example, in some embodiments, the amorphous n-type layer 214 may be formed via a chemical vapor deposition (CVD) process, for example such as a Plasma Enhanced Chemical Vapor Deposition (PECVD) in a suitable PECVD chamber (e.g., the PECVD chamber discussed above). The amorphous p-type layer 210 may be formed utilizing the same, or in some embodiments, different processing chamber utilized to form the micro-crystalline p-type layer 208 and/or amorphous p-type layer 210 described above. In embodiments where the amorphous n-type layer 214 is formed utilizing a different process chamber than the micro-crystalline p-type layer 208 and/or amorphous p-type layer 210, the separate process chambers may be coupled together as part of a processing system, for example, such as an inline tool, a cluster tool, or the like.

In some embodiments, the amorphous n-type layer 214 may comprise a dopant to enhance charge collection, thus increasing the efficiency of the device. The dopant may be any dopant suitable to provide the aforementioned enhancement, for example a Group V element such as phosphorus (P), arsenic (As), antimony (Sb), or the like. In some embodiments, the dopant may be phosphorus (P).

Figure 2G:
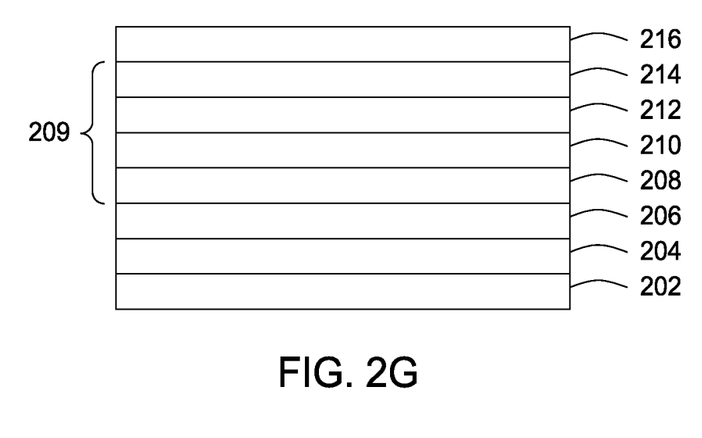

Next, at 114, a metal back layer 216 is deposited atop the p-i-n structure 209, as shown in FIG. 2G. The metal back layer 216 may comprise any suitable metal, for example such as zinc oxide (ZnO), aluminum (Al), gold (Au), titanium (Ti), chromium (Cr), silver (Ag), copper (Cu), platinum (Pt), alloys thereof, combinations thereof, or the like.

The metal back layer 216 may be deposited to any thickness suitable to suitable to provide the desired photovoltaic characteristics to the finished device. For example, in some embodiments, the metal back layer 216 may be deposited to a thickness of about 50 to about 200 nm.

The metal back layer 216 may be formed via any process suitable to deposit the metal back layer 216 in accordance with the materials utilized and desired thickness. For example, in some embodiments, the metal back layer 216 may be formed via a chemical vapor deposition (CVD) process, for example such as a Plasma Enhanced Chemical Vapor Deposition (PECVD) in a suitable PECVD chamber (e.g., the PECVD chamber discussed above). The metal back layer 216 may be formed utilizing the same, or in some embodiments, different processing chamber utilized to form the micro-crystalline p-type layer 208, amorphous p-type layer 210 and/or amorphous p-type layer 210 described above. In embodiments where the metal back layer 216 is formed utilizing a different process chamber than the micro-crystalline p-type layer 208, amorphous p-type layer 210 and/or amorphous p-type layer 210, the separate process chambers may be coupled together as part of a processing system, for example, such as an inline tool, a cluster tool, or the like.

After the metal back layer 216 is deposited, the method generally ends and the substrate may proceed for further processing. For example, other processes may be performed to form a finished device (i.e., photovoltaic cell), such as laser scribing processes or other deposition processes to form other films, materials, substrates, and/or packaging atop the metal back layer 216 to complete the device.

Figure 3:
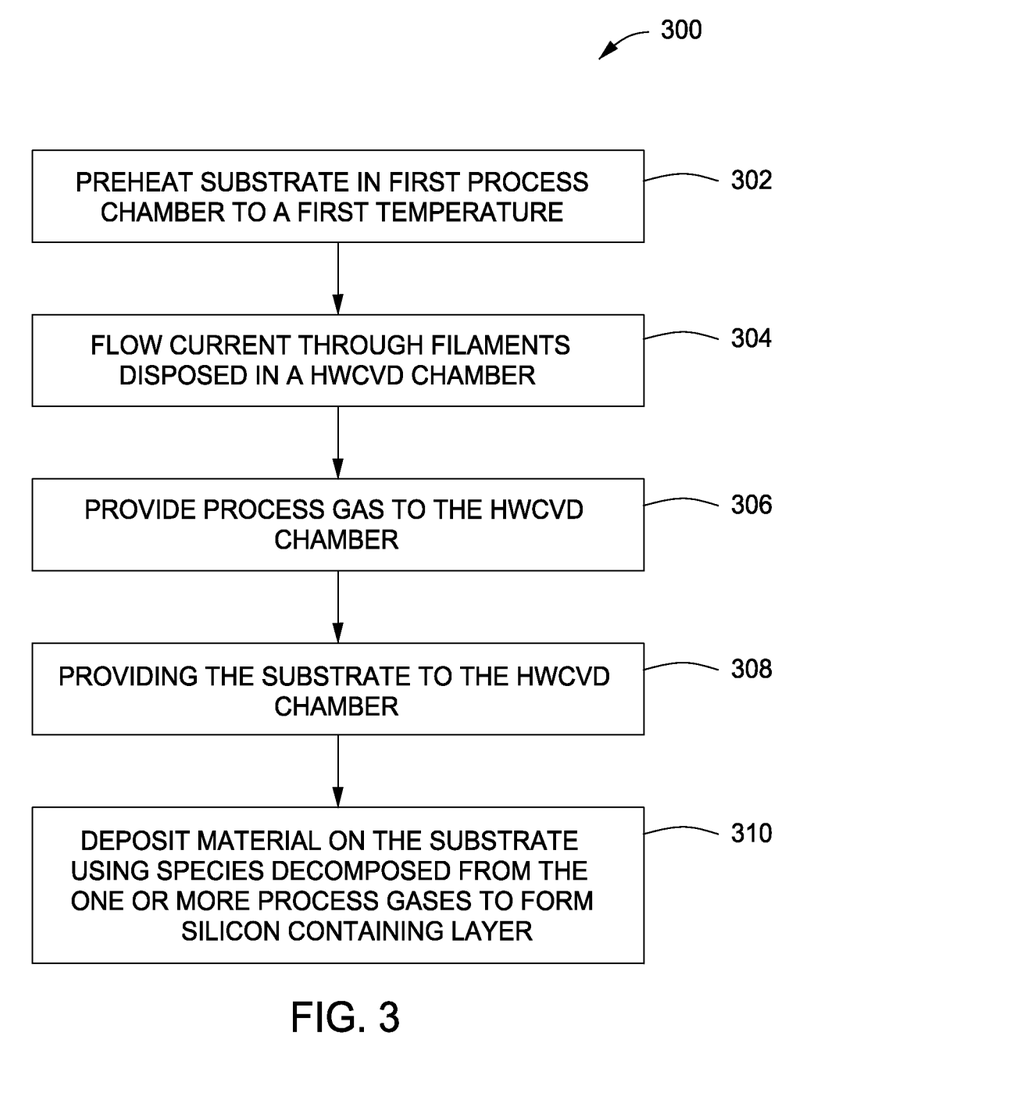
FIG. 3 is a flow diagram of a method for depositing a material via HWCVD in accordance with some embodiments of the present invention.

FIG. 3 is a flow diagram of a method 300 for depositing a material via HWCVD, for example, such as the amorphous i-type layer 212 described above. The method 300 may be performed in any apparatus suitable for processing semiconductor substrates in accordance with embodiments of the present invention, such as the apparatus discussed below with respect to FIG. 4.

The method 300 generally begins at 302 where a substrate (i.e., the substrate 202 having the TCO layer 204, protective layer 206, and the bi-layer p-type layer (e.g., the microcrystalline p-type layer 208 and amorphous p-type layer 210) formed thereon as described above) may optionally be preheated in a preheat chamber to a first temperature. Preheating the substrate prior to performing a deposition process (e.g. the deposition of material to form the amorphous i-type layer 212) facilitates a de-gassing and/or removal of contaminants from the substrate. In some embodiments, the preheat chamber may be the same chamber as used for the deposition process. In some embodiments, the preheat chamber is a different chamber than that used for the deposition process. Preheating the substrate in a different chamber than that used to perform the deposition process may reduce or eliminate the incidence of contamination of the substrate with residual process byproducts from the deposition process chamber and/or may reduce or eliminate the incidence of contamination of the deposition process chamber with materials from the substrate.

The preheat chamber may be any type of chamber suitable to preheat the substrate to the first temperature, for example such as a dedicated preheat chamber, an annealing chamber, a deposition chamber, or the like. In some embodiments the preheat chamber may be a HWCVD chamber such as the HWCVD chamber described below with respect to FIG. 4. In some embodiments, the preheat chamber may be one or a plurality of chambers coupled to a multi-chamber tool, for example such as a cluster tool or in-line HWCVD tool.

The first temperature may be any temperature suitable to de-gas or remove contaminants from the substrate. For example, in some embodiments, the substrate may be preheated to a first temperature of about 200 to about 300 degrees Celsius, or in some embodiments, about 300 degrees Celsius.

Next, at 304, a current is flowed through a plurality of filaments disposed in a HWCVD chamber to raise a temperature of the plurality of filaments to a second temperature. The current may be flowed through the plurality of filaments prior to, at the same time as, and/or subsequent to preheating the substrate, as described above at 302. The plurality of filaments may be any type of filaments disposed in any type of HWCVD chamber, for example such as the plurality of filaments disposed in the HWCVD chamber described below with respect to FIG. 4. By heating the plurality of filaments prior to providing the substrate to the HWCVD chamber (described below), contaminants and/or byproducts from previous processes may be reduced or removed from the HWCVD chamber, thereby reducing or eliminating the risk of contaminating the substrate in a subsequent process. The contaminants and/or byproducts may be disposed on the wires and/or on other components of the process chamber. In some embodiments, the plurality of filaments may be maintained at the second temperature continuously between subsequent processes performed in the HWCVD chamber, eliminating the need for repetitive heating and cooling of the filaments, which may reduce the overall amount of energy consumed, prolong the life of the plurality filaments, and/or increase the efficiency of the process.

The second temperature may be any temperature suitable to reduce or eliminate contaminants in the HWCVD chamber and/or perform a desired process on the substrate (e.g. the deposition process described below). For example, in some embodiments, the second temperature may be about 1600 to about 2000 degrees Celsius, or in some embodiments, about 1600 to about 1700 degrees Celsius.

Next, at 306, a process gas may be provided to the HWCVD chamber. The process gas may comprise any gas or gases suitable to perform a desired process within the HWCVD chamber. For example, in embodiments where amorphous i-type layer 212 is being deposited atop the substrate such as described below, the process gases may comprise a silicon (Si) containing gas. In such embodiments, the silicon (Si) containing gas may be any suitable gas containing silicon (Si) and not hydrogen, for example such as tetrafluorosilane ($SiF_4$), or the like. In some embodiments, the silicon (Si) containing gas may be a silicon and hydrogen containing gas, such as silane ($SiH_4$), disilane ($Si_2H_6$), or the like. The silicon (Si) (or silicon and hydrogen) containing gas may be provided at any flow rate suitable to deposit the silicon (Si) containing layer and may be adjusted in accordance with the substrate and/or HWCVD chamber size. For example, in embodiments where the substrate is a circular substrate such as 300 mm wafer, the silicon (Si) (or silicon and hydrogen) containing gas may be provided at a flow rate of about 5 to about 50 sccm, or in some embodiments, about 15 sccm. Alternatively, in embodiments where the substrate 200 is a rectangular substrate, for example such as an about 1000 mm×1250 mm substrate or an about 2200 mm×2500 mm substrate, the silicon (Si) (or silicon and hydrogen) containing gas may be provided at a flow rate of about 50 to about 500 sccm, or in some embodiments, about 150 sccm.

In some embodiments, the process gas may optionally further comprise hydrogen ($H_2$) gas. The hydrogen ($H_2$) gas may be provided at any flow rate to provide a desired dilution of the process gas. For example, in some embodiments, the process gas may comprise a hydrogen ($H_2$) dilution of about 0 to about 50% of hydrogen ($H_2$) gas. The inventor has observed that varying the dilution of the process gas with hydrogen ($H_2$), the state (i.e., crystalline or amorphous content) of the deposited layer may be controlled. In some embodiments, to form the amorphous i-type layer 212, the hydrogen gas may be provided at a flow rate of up to about 500 sccm, or in some embodiments, about 150 sccm. In some embodiments, to form the amorphous i-type layer 212, no hydrogen gas is provided.

Next, at 308, the substrate is provided to the HWCVD chamber. The substrate may be transferred from the preheat chamber to the HWCVD chamber via any means suitable to transfer the substrate while maintaining the substrate temperature. In some embodiments, for example where the HWCVD chamber is part of a cluster tool, the substrate may be transferred via a transfer robot disposed in a transfer chamber. Alternatively, in some embodiments, for example where the HWCVD chamber is part of an inline tool, the substrate may be transferred via a linear conveyor directly from the preheat chamber to the HWCVD chamber or through a separation chamber disposed between the preheat chamber and the HWCVD chamber.

At 310, the amorphous i-type layer 212 is deposited atop the amorphous p-type layer 210 (e.g. as shown in FIG. 2E) using species decomposed from the process gas to form the amorphous i-type layer 212. The amorphous i-type layer 212 may be any silicon (Si) containing layer suitable for any desired application, for example, such as described above. The amorphous i-type layer 212 may be deposited to any thickness suitable for a particular application, for example, such as about 100 to about 10,000 angstroms (Å).

The HWCVD chamber (or the HWCVD source, such as the filaments or wires 410 described below with respect to FIG. 4) may be maintained at any temperature suitable to facilitate the decomposition of the process gas species. For example, in some embodiments, the filaments may be maintained at a temperature of about 1600 to about 2000 degrees Celsius, or in some embodiments, about 1700 degrees Celsius, or in some embodiments, about 1800 degrees Celsius. In some embodiments, the temperature within the HWCVD chamber may be measured, for example, via a pyrometer.

To facilitate the deposition of the amorphous i-type layer 212 the substrate may be positioned under a HWCVD source (e.g., the filaments or wires 410 described below with respect to FIG. 4) such that the substrate is exposed to the process gas and decomposed species thereof, thereby allowing the material to deposit on the substrate to form the amorphous i-type layer 212. The substrate may be positioned under the HWCVD source on a substrate support (e.g., substrate support 428 described below with respect to FIG. 3) in a static position or, in some embodiments, may move for dynamic deposition as the substrate passes under the HWCVD source.

In addition to the above, additional process parameters may be utilized to facilitate forming the amorphous i-type layer 212. For example, in embodiments where the process chamber may be maintained at a pressure of about 10 to about 50 mTorr, or, in some embodiments, about 22 mTorr.

After depositing the material at 310, the method 300 generally ends and the substrate may proceed for further processing, for example, such as deposition of the amorphous n-type layer 214 described above at 116.

Figure 4:
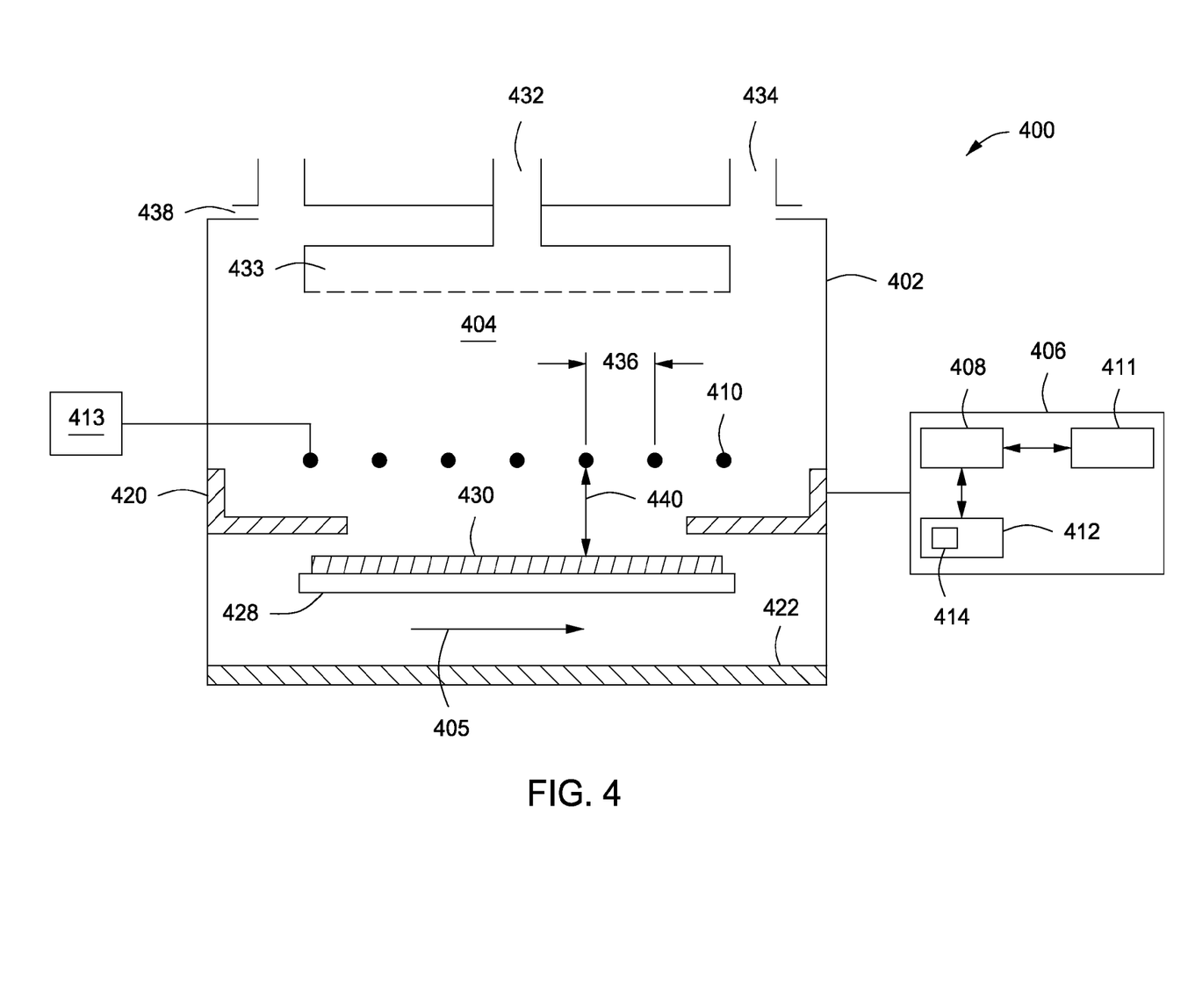
FIG. 4 is a HWCVD chamber suitable for performing the methods depicted in FIG. 3 in accordance with some embodiments of the present invention.

FIG. 4 depicts a schematic side view of a HWCVD process chamber 400 suitable for use in accordance with embodiments of the present invention. The HWCVD process chamber 400 may be a standalone chamber or part of a cluster tool, such as one of the CENTURA® or ENDURA® line of cluster tools available from Applied Materials, Inc. Alternatively, the HWCVD process chamber 400 may be part of an in-line processing tool, such as the in-line processing tool described in United States Patent Application Publication 2011-0104848, published May 5, 2011, to Dieter Haas, et al.

The process chamber 400 generally comprises a chamber body 402 having an internal processing volume 404. A plurality of filaments, or wires 410, are disposed within the chamber body 402 (e.g., within the internal processing volume 404). The plurality of wires 410 may also be a single wire routed back and forth across the internal processing volume 404. The plurality of wires 410 comprise a HWCVD source. The wires 410 may comprise any suitable conductive material, for example, such tungsten, tantalum, iridium, nickel-chrome, palladium, or the like. The wires may 410 comprise any thickness suitable to provide a desired temperature to facilitate a process in the process chamber 400. For example, in some embodiments, each wire 410 may comprise a diameter of about 0.2 to about 1 mm, or in some embodiments, about 0.5 mm, or in some embodiments, about 0.75 mm. The inventor has observed that by increasing the diameter of each wire 410, the surface area of the wire 410 is increased, thus providing a larger reactive surface area to facilitate decomposing the process gas (e.g., the process gas described above), thereby increasing the amount of process gas decomposed and efficiency of the decomposition. For example, in embodiments where a process gas comprising silane ($SiH_4$) is utilized to form a silicon containing layer (e.g., as described above), by providing a larger reactive surface, the decomposition of the silane ($SiH_4$) is enhanced, thereby providing an increased amount of atomic hydrogen and silicon mono hydride (Si—H) within the process chamber. By providing the increased amount of hydrogen and silicon mono hydride (Si—H) within the process chamber, less hydrogen gas ($H_2$) is required within the process gas, thereby decreasing the hydrogen dilution of the process gas, thus providing a faster deposition rate and a resultant film having improved properties (e.g., transport properties, dark conductivity, photo response, or the like).

However, as the diameter of the wire 410 increases, an amount of heat transmitted by the wire 410 increases, thereby causing the surface of the substrate to increase. For example, the inventor has observed that when increasing the diameter of the wire 410 from 0.5 mm to 0.75 mm, the temperature of the substrate may increase about 50 degrees Celsius or higher. Accordingly, the inventor has observed that by utilizing a woven wire, for example, such as two or more strands of wire woven together to form a single wire, the surface area of the wire may be increased without increasing the amount of heat transmitted from the wire 410 to the substrate 430. For example, in some embodiments, the wire 410 may comprise two strands of wire, each having a diameter of about 0.1 to about 0.5 mm, or in some embodiments, about 0.2 mm. In addition to the above, the inventor has observed that by using a, by using a woven wire, the mechanical strength of the wire 410 may be increased, thereby reducing instances of mechanical failure and increasing the useful life of the wire 410.

Each wire 410 is clamped in place by support structures (not shown) to keep the wire taught when heated to high temperature, and to provide electrical contact to the wire. In some embodiments, a distance between each wire 410 (i.e., the wire to wire distance 436) may be varied to provide a desired temperature profile within the process chamber 400. For example, in some embodiments, the wire to wire distance 436 may be about 20 to about 120 mm, or in some embodiments about 45 mm, or in some embodiments about 60 mm, or in some embodiments, about 90 mm. The inventor has observed that by varying the distance between each wire 410, the state of the (i.e., crystalline or amorphous content) deposited layer may be controlled. It is believed that as the reacting area of the filaments changes, the gas phase and surface reactions also change, and consequently, the film morphology changes as well. For example, the inventor has observed that as distance between each wire 410 decreases, the crystallinity of the deposited layer decreases.

Any number of wires 410 may be utilized within the process chamber 400 to provide a desired temperature profile within the process chamber 400. For example, in some embodiments, the process chamber 400 may comprise four wires 410, or in some embodiments, more or less than 4 wires 410. The inventor has observed that by increasing the amount of wires 410 within the process chamber, a larger reactive surface area to facilitate decomposing the process gas (e.g., the process gas described above) may be provided, thereby increasing the amount of process gas decomposed and efficiency of the decomposition, for example similar to the effect of the increased surface area of the wires having a larger diameter described above.

A power supply 413 is coupled to the wire 410 to provide current to heat the wire 410. A substrate 430 may be positioned under the HWCVD source (e.g., the wires 410), for example, on a substrate support 428. The substrate support 428 may be stationary for static deposition, or may move (as shown by arrow 405) for dynamic deposition as the substrate 430 passes under the HWCVD source. In some embodiments, a distance between each wire 410 and the substrate 430 (i.e., the wire to substrate distance 440) may be varied to facilitate a particular process being performed in the process chamber 400. For example, in some embodiments, the wire to substrate distance 440 may be about 20 to about 120 mm, or in some embodiments about 45 mm, or in some embodiments, about 60 mm.

The chamber body 402 further includes one or more gas inlets (one gas inlet 432 shown) to provide one or more process gases and one or more outlets (two outlets 434 shown) to a vacuum pump to maintain a suitable operating pressure within the process chamber 400 and to remove excess process gases and/or process byproducts. The gas inlet 432 may feed into a shower head 433 (as shown), or other suitable gas distribution element, to distribute the gas uniformly, or as desired, over the wires 410.

In some embodiments, one or more shields 420 may be provided to minimize unwanted deposition on interior surfaces of the chamber body 402. Alternatively or in combination, one or more chamber liners 422 can be used to make cleaning easier. The use of shields, and liners, may preclude or reduce the use of undesirable cleaning gases, such as the greenhouse gas $NF_3$. The shields 420 and chamber liners 422 generally protect the interior surfaces of the chamber body from undesirably collecting deposited materials due to the process gases flowing in the chamber. The shields 420 and chamber liners 422 may be removable, replaceable, and/or cleanable. The shields 420 and chamber liners 422 may be configured to cover every area of the chamber body that could become coated, including but not limited to, around the wires 410 and on all walls of the coating compartment. Typically, the shields 420 and chamber liners 422 may be fabricated from aluminum (Al) and may have a roughened surface to enhance adhesion of deposited materials (to prevent flaking off of deposited material). The shields 420 and chamber liners 422 may be mounted in the desired areas of the process chamber, such as around the HWCVD sources, in any suitable manner. In some embodiments, the source, shields, and liners may be removed for maintenance and cleaning by opening an upper portion of the deposition chamber. For example, in some embodiments, the a lid, or ceiling, of the deposition chamber may be coupled to the body of the deposition chamber along a flange 438 that supports the lid and provides a surface to secure the lid to the body of the deposition chamber.

A controller 406 may be coupled to various components of the process chamber 400 to control the operation thereof. Although schematically shown coupled to the process chamber 400, the controller may be operably connected to any component that may be controlled by the controller, such as the power supply 412, a gas supply (not shown) coupled to the inlet 432, a vacuum pump and or throttle valve (not shown) coupled to the outlet 434, the substrate support 428, and the like, in order to control the HWCVD deposition process in accordance with the methods disclosed herein. The controller 406 generally comprises a central processing unit (CPU) 408, a memory 412, and support circuits 411 for the CPU 408. The controller 406 may control the HWCVD process chamber 400 directly, or via other computers or controllers (not shown) associated with particular support system components. The controller 406 may be one of any form of general-purpose computer processor that can be used in an industrial setting for controlling various chambers and sub-processors. The memory, or computer-readable medium, 412 of the CPU 408 may be one or more of readily available memory such as random access memory (RAM), read only memory (ROM), floppy disk, hard disk, flash, or any other form of digital storage, local or remote. The support circuits 411 are coupled to the CPU 408 for supporting the processor in a conventional manner. These circuits include cache, power supplies, clock circuits, input/output circuitry and subsystems, and the like. Inventive methods as described herein may be stored in the memory 412 as software routine 414 that may be executed or invoked to turn the controller into a specific purpose controller to control the operation of the process chamber 400 in the manner described herein. The software routine may also be stored and/or executed by a second CPU (not shown) that is remotely located from the hardware being controlled by the CPU 408.

Thus, p-i-n structures and methods for forming p-i-n structures useful, for example, in photovoltaic cells, have been provided. The p-i-n structures have an amorphous i-type layer that advantageously has a reduced amorphous network disorder as compared to conventionally formed amorphous i-type layers, thereby reducing light induced degradation (LID). In embodiments where the amorphous i-type layer is a photovoltaic grade i-type layer, for use in, for example, a photovoltaic cell, the reduced light induced degradation advantageously increases the overall efficiency of the finished device. The inventive structure and methods of fabrication may further advantageously reduce hydrogen diffusion into layers disposed beneath the p-i-n structure (e.g. the substrate and or TCO layer) when fabricating the p-i-n structure, thereby further increasing the efficiency of a device incorporating the p-i-n structure, such as a photovoltaic device.

While the foregoing is directed to embodiments of the present invention, other and further embodiments of the invention may be devised without departing from the basic scope thereof.

The invention claimed is:

1. A method for forming a p-i-n structure on a substrate, comprising:
    forming a bi-layer p-type layer on the substrate by:
        depositing a microcrystalline p-type layer atop a protective layer; and
        depositing an amorphous p-type layer atop the microcrystalline p-type layer;
    depositing an amorphous i-type layer via hot wire chemical vapor deposition atop the amorphous p-type layer; and
    depositing an amorphous n-type layer atop the amorphous i-type layer.

2. The method of claim 1, further comprising:
    depositing a protective layer atop the substrate; and
    forming the bi-layer p-type layer atop the protective layer.

3. The method of claim 2, wherein the protective layer comprises zinc oxide (ZnO).

4. The method of claim 1, wherein the microcrystalline p-type layer comprises silicon (Si) or silicon carbide (SiC).

5. The method of claim 1, wherein the amorphous p-type layer comprises silicon (Si), silicon carbide (SiC), or boron doped silicon.

6. The method of claim 1, wherein the amorphous i-type layer comprises silicon or silicon and hydrogen (Si—H).

7. The method of claim 1, wherein the amorphous n-type layer comprises silicon (Si) or phosphorus doped silicon.

8. The method of claim 1, further comprising:
    depositing a metal back layer atop the p-i-n structure.

9. The method of claim 8, wherein the metal back layer comprises at least one of zinc oxide (ZnO), aluminum (Al), gold (Au), titanium (Ti), chromium (Cr), silver (Ag), copper (Cu), or platinum (Pt).

10. The method of claim 1, wherein the substrate includes a transparent conducting oxide (TCO) layer formed thereon and wherein the p-i-n structure is formed atop the TCO layer.

11. The method of claim 10, wherein the TCO layer comprises at least one of tin oxide (SnO), zinc oxide (ZnO), or cadmium stannate ($Cd_2SnO_4$).

* * * * *